(12) United States Patent
Wu et al.

(10) Patent No.: US 11,177,218 B2
(45) Date of Patent: Nov. 16, 2021

(54) PACKAGE INCLUDING METALLIC BOLSTERING PATTERN AND MANUFACTURING METHOD OF THE PACKAGE

(71) Applicant: Taiwan Semiconductor Manufacturing Co., Ltd., Hsinchu (TW)

(72) Inventors: Jiun-Yi Wu, Taoyuan (TW); Chien-Hsun Lee, Hsin-chu County (TW); Shou-Yi Wang, Hsinchu (TW); Chien-Hsun Chen, Pingtung County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/824,722

(22) Filed: Mar. 20, 2020

(65) Prior Publication Data

US 2021/0296243 A1 Sep. 23, 2021

(51) Int. Cl.
*H01L 25/065* (2006.01)
*H01L 23/538* (2006.01)
(Continued)

(52) U.S. Cl.
CPC ......... *H01L 23/5384* (2013.01); *H01L 21/52* (2013.01); *H01L 21/563* (2013.01); *H01L 23/3121* (2013.01); *H01L 24/05* (2013.01); *H01L 25/0655* (2013.01); *H01L 2224/02372* (2013.01)

(58) Field of Classification Search
CPC ............... H01L 21/563; H01L 25/0655; H01L 2224/02372; H01L 25/0657; H01L 24/83; H01L 23/3128; H01L 21/56; H01L 24/29; H01L 23/3107; H01L 23/49816; H01L 24/16; H01L 24/81; H01L 21/565; H01L 24/32; H01L 24/13; H01L 24/45; H01L 21/566; H01L 24/09
USPC ........ 257/678, 774; 438/629, 637, 639, 640, 438/667, 668, 672, 675, 700, 701, 713, 438/978
See application file for complete search history.

(56) References Cited

U.S. PATENT DOCUMENTS 9,000,584 B2 4/2015 Lin et al.
9,048,222 B2 6/2015 Hung et al.
(Continued)

*Primary Examiner* — Didarul A Mazumder
(74) *Attorney, Agent, or Firm* — JCIPRNET

(57) ABSTRACT

A package has a first semiconductor die, a second semiconductor die, a redistribution structure and a metallic bolstering pattern. The second semiconductor die is disposed beside the first semiconductor die and spaced apart from the first semiconductor die with a distance. The redistribution structure is disposed over the first semiconductor die and the second semiconductor die and is electrically connected with the first and second semiconductor dies. The metallic bolstering pattern is disposed between the redistribution structure and the first and second semiconductor dies. The metallic bolstering pattern is disposed on the redistribution structure and located over the first and second semiconductor dies, and the metallic bolstering pattern extends across the distance between the first and second semiconductor dies and extends beyond borders of the first and second semiconductor dies.

20 Claims, 14 Drawing Sheets

(51) Int. Cl.
    *H01L 23/31*    (2006.01)
    *H01L 21/52*    (2006.01)
    *H01L 23/00*    (2006.01)
    *H01L 21/56*    (2006.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 2018/0026001 A1* | 1/2018 | Chen ............... H01L 24/19 257/773 |
| 2018/0151498 A1* | 5/2018 | Lu ............... H01L 23/5389 |
| 2019/0096841 A1* | 3/2019 | Liu ............... H01L 23/5384 |
| 2019/0237423 A1* | 8/2019 | Chen ............... H01L 24/24 |
| 2020/0058622 A1* | 2/2020 | Chen ............... H01L 24/80 |

\* cited by examiner

PACKAGE INCLUDING METALLIC BOLSTERING PATTERN AND MANUFACTURING METHOD OF THE PACKAGE

BACKGROUND

Redistribution layers are used in packages for spreading contact points around the semiconductor dies. The formation of fin-line redistribution layers allows for fabricating high integration packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
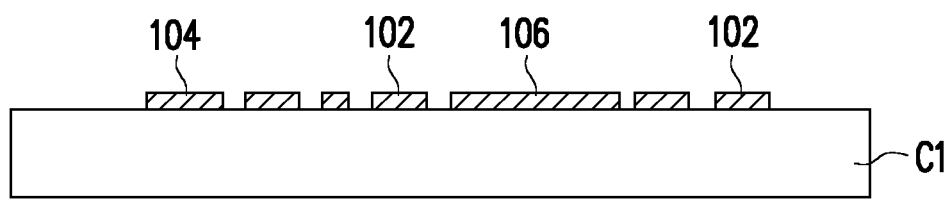
FIGS. 1-8 schematically illustrate various stages of processes for forming a package structure with redistribution layers according to a method of fabricating a semiconductor package in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one component or feature's relationship to another component(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 9:
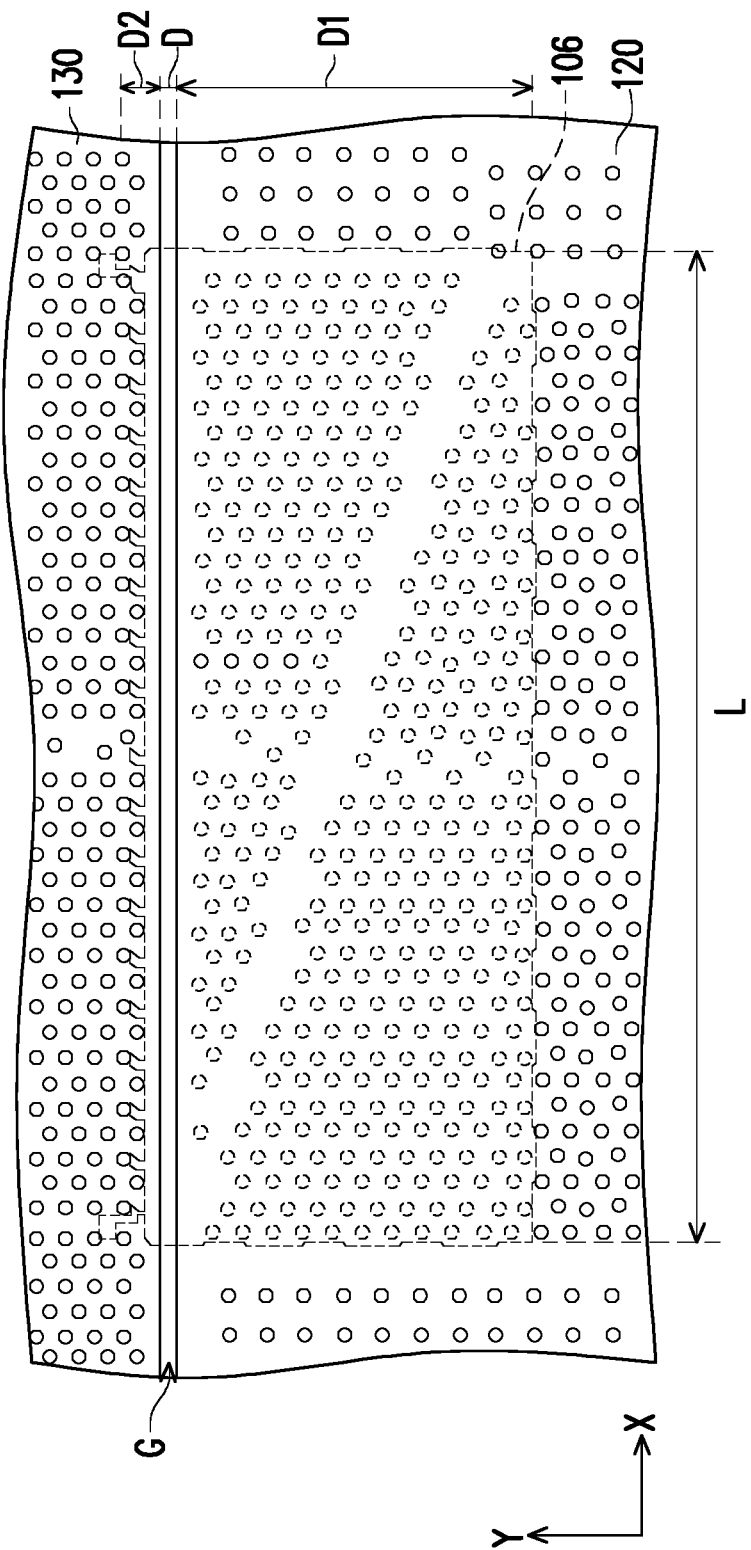
FIGS. 9-10 schematically illustrate a structure having bolstering patterns in accordance with some embodiments.
Figure 10:
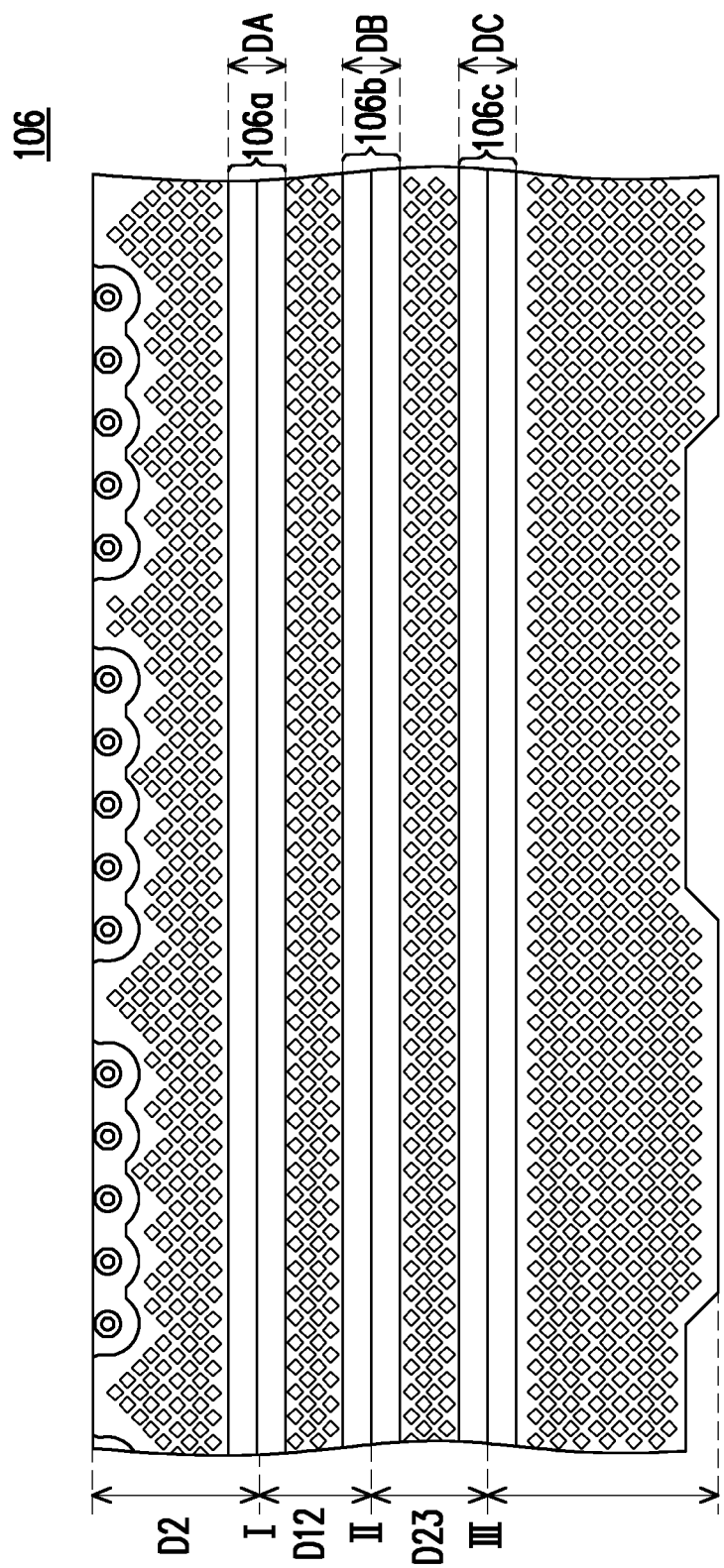

FIG. 1 to FIG. 8 schematically illustrate various stages of processes for forming a package structure with redistribution layers according to a method of fabricating a semiconductor package in accordance with some embodiments. FIGS. 9-10 schematically illustrate a package structure having bolstering patterns in accordance with some embodiments.

Referring to FIG. 1, a carrier C1 is provided with a metallic material layer 100 formed thereon. In some embodiment, the carrier C1 may be a glass carrier or any suitable carrier for the manufacturing method of the packages. In some embodiments, a debond layer (not shown) may be provided on the carrier C1, and the material of the debond layer may be any material suitable for bonding and debonding the carrier C1 from the above layer(s) or any structure thereon. In some embodiments, the debond layer may include a release layer (such as a light-to-heat conversion ("LTHC") layer).

In certain embodiments, the metallic material layer 100 is formed by physical vapor deposition (PVD), chemical vapor deposition (CVD), plating or lamination. In one embodiment, the metallic material layer 100 is formed by depositing a metallic material (not shown) over the carrier C1 and then patterning the metallic material by photolithography and etching process. In one embodiment, the metallic material layer 100 is formed by forming a seed layer over the carrier C1 and then plating with a mask pattern. A material of the metallic material layer 100 may include one or more metal materials, such as copper (Cu), aluminum (Al), silver (Ag), tin (Sn), gold (Au), nickel (Ni), titanium (Ti), combinations or alloys thereof. In some embodiments, the metallic material layer 100 includes pads 102, routing patterns 104 and bolstering patterns 106. For example, the pads 102 may be connected with the routing patterns 104, but the bolstering patterns 106 are not connected with the pads 102 or the routing patterns 104. In one embodiment, the thickness of the metallic material layer 100 ranges from about 1 micron to about 10 microns. In one embodiment, the thickness of the metallic material layer 100 may be about 5 microns.

Figure 2:
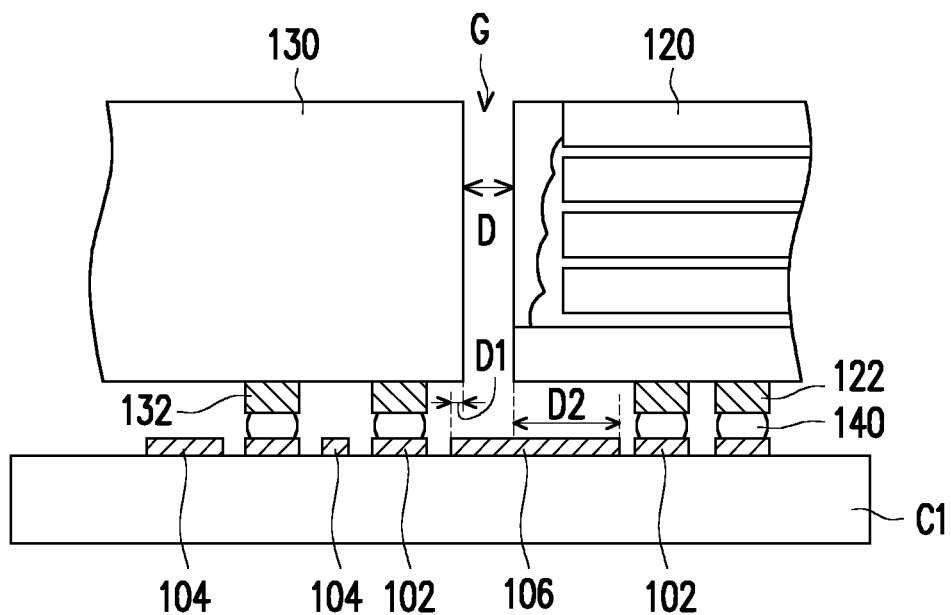
Figure 3:
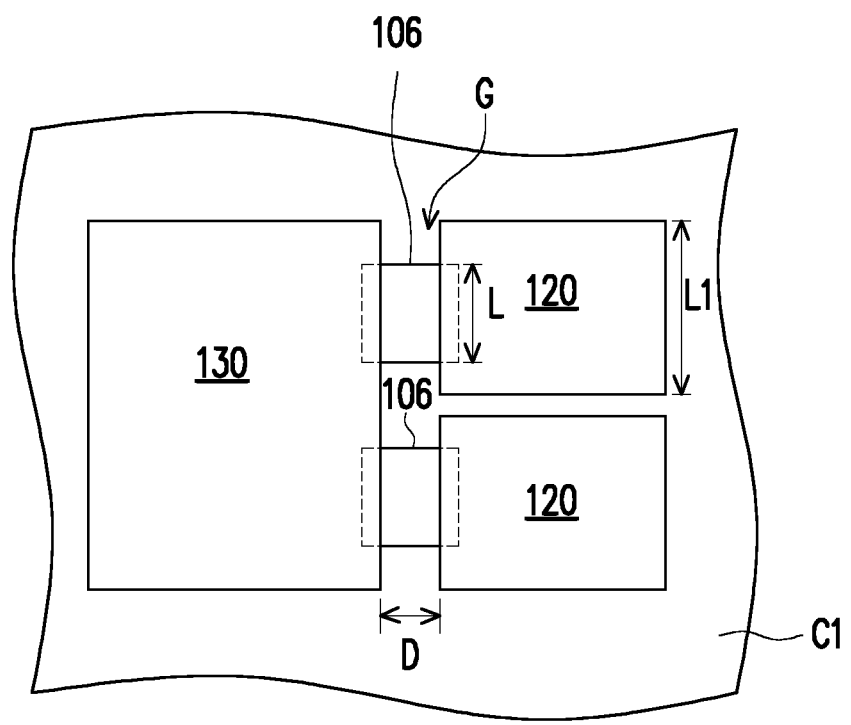

From the cross-sectional view of FIG. 2, at least one first die 120 and at least one second die 130 are provided and disposed over the carrier C1. FIG. 3 shows a schematic top view of the structure in FIG. 2, it is seen that two first dies 120 are disposed beside one second die 120. In one embodiment, the first dies 120 are arranged in parallel and both first dies 120 are spaced apart from the second die 130 with a gap G (with a distance D). It is understood that the number(s) of the first or second dies 120 is not limited to the embodiments herein. For example, a plurality of first dies 120 and a plurality of second dies 130 are provided, and the amount of the first dies 120 may be different from the amount of the second dies 130. In some embodiments, the first die 120 and the second die 130 may have different functions or include chips of different functions. In some embodiments, the first die 120 and the second die 130 may have the same function or include chips of the same function. In some embodiments, the first die 120 includes one or more memory chips, such as high bandwidth memory chips, dynamic random access memory (DRAM) chips or static random access memory (SRAM) chips. In some embodiments, the second die 130 may include one or more of an application-specific integrated circuit (ASIC) chip, an analog chip, a sensor chip, a wireless application chip (such as a Bluetooth chip or a radio frequency chip) or a voltage regulator chip. In some embodiments, the first die 120 may be a memory die including memory chips, and the second die 130 may be a system-on-chip (SoC) die including a controller chip and one or more memory chips.

As shown in FIG. 2, the first die 120 and the second die 130 are disposed on the metallic material layer 100, and contact terminals 122, 132 of the first and second dies 120, 130 are connected to the pads 102 of the metallic material layer 100 by performing a bonding process. For example, the contact terminals 122, 132 of the first and second dies 120, 130 to the pads 102 of the metallic material layer 100 and aligning the first and second dies 120, 130 to ensure the vertical projections of the first and second dies 120, 130 to fall into the span of the bolstering pattern 106. After performing the bonding process, the contact terminals 122, 132 of the first and second dies 120, 130 are bonded to the pads 102 of the metallic material layer 100 through a solder material 140. In some embodiments, the bonding process includes a thermal process. In FIG. 2 & FIG. 3, the first and second dies 120, 130 are positioned side-by-side and the first and second dies 120, 130 are spaced apart from each other with a distance D. For example, depending on the sizes of the die and the package structure, the distance D ranges from about 30 microns to about 250 microns. In one embodiment, the thickness of the metallic material layer is about 5 microns, and after bonding, the bottom surface of the first/second die 120/130 is distanced from the routing patterns 104 and the bolstering pattern 106 with a space therebetween. In certain embodiments, as seen in FIG. 3, the most adjacent two facing sides of the first and second dies 120, 130 are substantially in parallel. The arrangement of the first and second dies 120, 130 are controlled so that the underlying bolstering patterns 106 are located between the first and second die 120, 130. From FIG. 3, the two bolstering patterns 106 are respectively located between the two first dies 120 and the second die 130 and further extend into the spans of the first and second dies 120, 130. In some embodiments, in FIG. 2, the bolstering pattern 106 extends into the span of the first die 120 with an extending distance D1 and extends into the span of the second die 130 with an extending distance D2. That is, the first die 120 is specifically arranged so that the vertical projection of the first die 120 partially overlaps with the bolstering pattern 106 with the distance D1, and the second die 130 is specifically arranged so that the vertical projection of the second die 130 partially overlaps with the bolstering pattern 106 with the distance D2. In other words, a vertical projection of the bolstering pattern falls within a span of the first semiconductor die, falls over the gap and falls within a span of the second semiconductor die. The bolstering pattern 106 spreads across the gap G and spreads beyond the edges of the first and second dies 120, 130.

FIG. 9 and FIG. 10 are schematic top views of a portion of the package structure showing the size and position of the bolstering pattern 106 relative to the first die 120 and the second die 130. In some embodiments, referring to FIG. 9, the bolstering pattern 106 has a rectangular shape, and the bolstering pattern 106 extends from the margin portion of the second die 130 (with the extending distance D2), extends across the gap G (with the distance D) and further extends into the first die 120 (with the extending distance DD. The shape of the bolstering pattern 106 may be modified based on the layout design of the die(s) and the shape of the bolstering pattern 106 may be a square, a tetragon, a quadrangle, or a polygon, for example. Depending on the layout design of the first die, the distance D1 may be about 2300 microns. Referring to FIGS. 3 and 9, considering the gap extending direction X of the gap G (the distance D is the shortest distance perpendicular to the direction X), the length L of the bolstering pattern 106 is smaller than the length L1 of the first die 120 (see FIG. 3). In some embodiments, the ratio of the length L of the bolstering pattern 106 to the length L1 of the first die 120 ranges from about 0.1 to about 1.0. Depending on the size of the die or the trace area of the die, the length L of the bolstering pattern 106 may range from about 6,500 microns to 13,000 microns, for example. In the example shown in FIG. 10, the extending distance D2 measuring from the border (shown as the edge line I) of the second die 130 may be about 140 microns. The edge line II or III refers to the possible border of the first die 120, depending on what kind of die used, and the distance D of the gap G may be equivalent to distance D12 or distance (D12+D23). In one embodiment, the distance D12 or D23 may be about 100 microns. In some embodiments, the bolstering pattern 106 is designed to be a meshed metallic pattern having small through holes distributed almost uniformly over the whole pattern. In some embodiments, the bolstering pattern 106 is designed to be a meshed metallic pattern having small through holes distributed uniformly in certain regions; however, within the bolstering pattern 106, the regions 106a, 106b or 106c adjacent to the edge line I, II or III may be designed to be solid metallic sheet without through holes for further strengthening the structure. The distance DA, DB or DC of the regions 106a, 106b or 106c may be about 50 microns.

Figure 4:
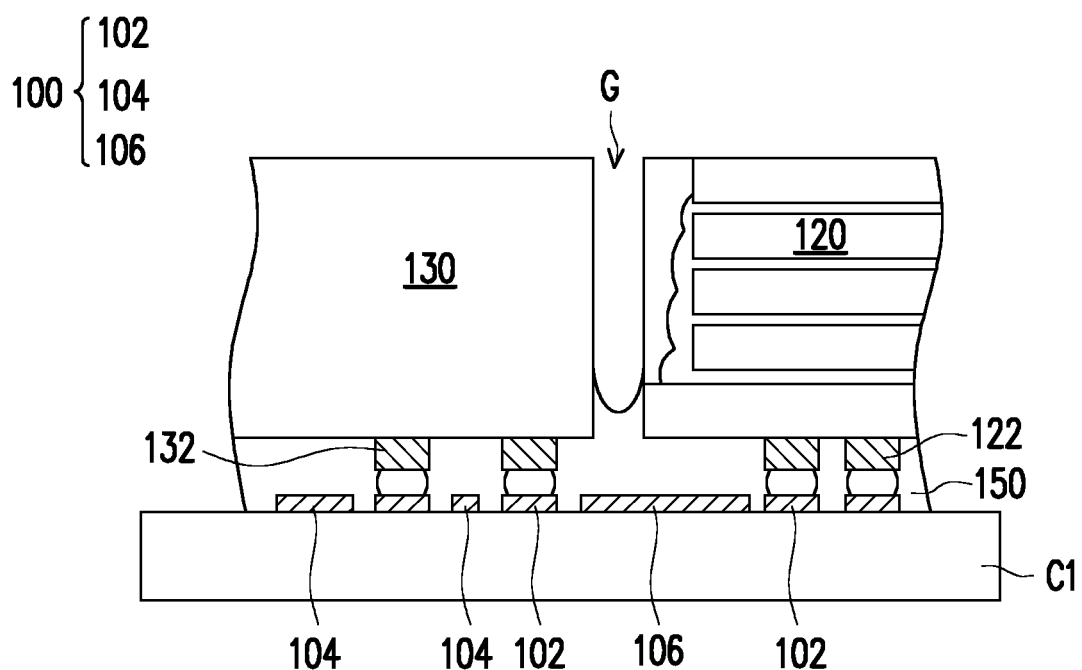

Referring to FIG. 4, in some embodiments, an underfill 150 is dispensed over the carrier C1 covering the metallic material layer 100, wrapping the contact terminals 122, 132, the solder material 140 and at least partially filling into the gap G. The underfill 150 fills up the space between the bottom surface of the first/second die 120/130 and the metallic material layer 100 (covering the routing patterns 104 and the bolstering pattern 106. In principle, the underfill 150 is filled between the first and second dies 120, 130 and the carrier C1. The underfill 150 encapsulates the contact terminals of the dies and is used for buffering against the possible thermal stress produced between the dies and the metallic material layer 100 on the carrier C1. The underfill 150 may be formed by dispensing and then performing curing, and the material of the underfill 150 may be a thermal-cured material or a resin material.

Figure 5:
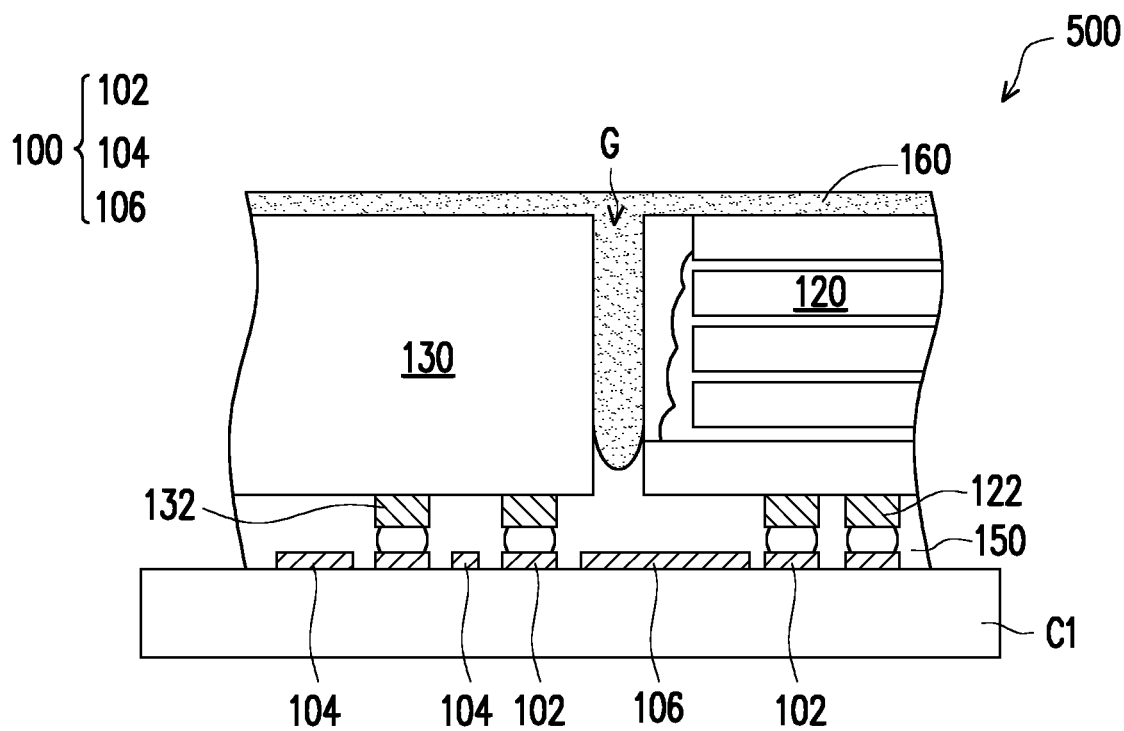

Referring to FIG. 5, an insulating encapsulation material 160 is formed over the carrier C1 and on the underfill 150, and the insulating encapsulation material 160 encapsulates the first and second dies 120, 130 (covering the top surfaces and sidewalls of the first and second dies) and fills up the gaps G between the first and second dies 120, 130 to form a molded structure 500. In some embodiments, as the underfill 150 does not completely fill up the gaps G, the later formed insulating encapsulation material 160 fills into and fills up the gaps G. In some embodiments, the insulating encapsulation material 160 is formed of an epoxy resin molding compound using the mold underfill (MUF) process.

Figure 6:
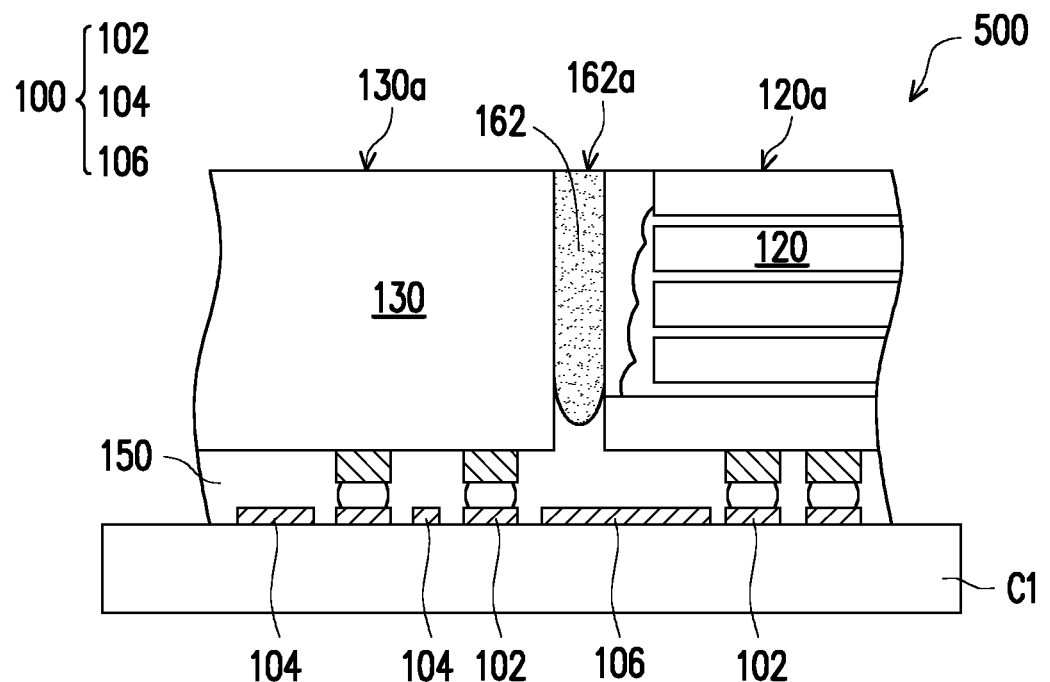

Referring to FIG. 6, a planarization process is performed to the molded structure 500 to remove portions of the insulating encapsulation material 160 above the top surfaces 120a, 130a of the first and second dies 120, 130 and a planarized encapsulant 162 is obtained. After planarization, the top surfaces 120a, 130a of the first and second dies 120, 130 are coplanar and levelled with the top surface 162a of the planarized encapsulant 162. That is, the top surfaces 120a, 130a of the first and second dies 120, 130 are exposed from the planarized encapsulant 162. In FIG. 6, the encapsulant 162 is located within the gap(s) G, sandwiched between the facing sidewalls of the first and second dies 120, 130 and laterally wraps around the first and second dies 120, 130. In some embodiments, the planarization process may include a chemical-mechanical polishing (CMP) process, a mechanical grinding process, a fly cutting process or an etching back process. In some embodiments, the planarization process may include a CMP process.

Although the first and second dies 120, 130 shown in the figures are of a substantial same thickness, it is understood that the die thickness of first die 120 and the die thickness of the second die 130 may be different, and the planarization process performed to the backsides of the first and second dies 120, 130 can equalize the thickness for the first and second dies 120, 130 and eliminate the height variation between the first and second dies 120, 130.

Figure 7:
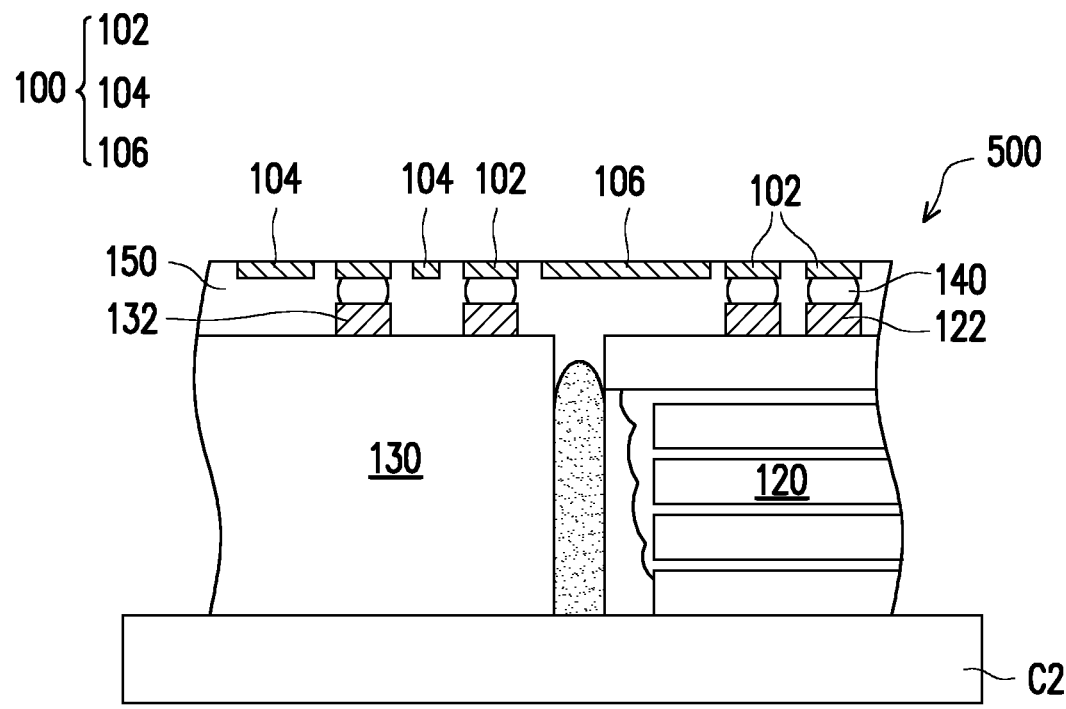

In FIG. 7, the structure 500 is debonded and detached from the carrier C1, then the structure 500 is tuned upside down and then transferred to another carrier C2. As seen in FIG. 7, the metallic material layer 100 (including the bolstering patterns 106 and the routing patterns 104) are exposed from the underfill 150. In some embodiment, the carrier C2 may be a glass carrier or any suitable carrier for the manufacturing method of the packages. In some embodiments, a debond layer (not shown) may be provided on the carrier C2, and the material of the debond layer may be any material suitable for bonding and debonding the carrier C2 from the above layer(s) or any structure thereon. In some embodiments, the debond layer may include a release layer (such as a light-to-heat conversion ("LTHC") layer).

Figure 8:
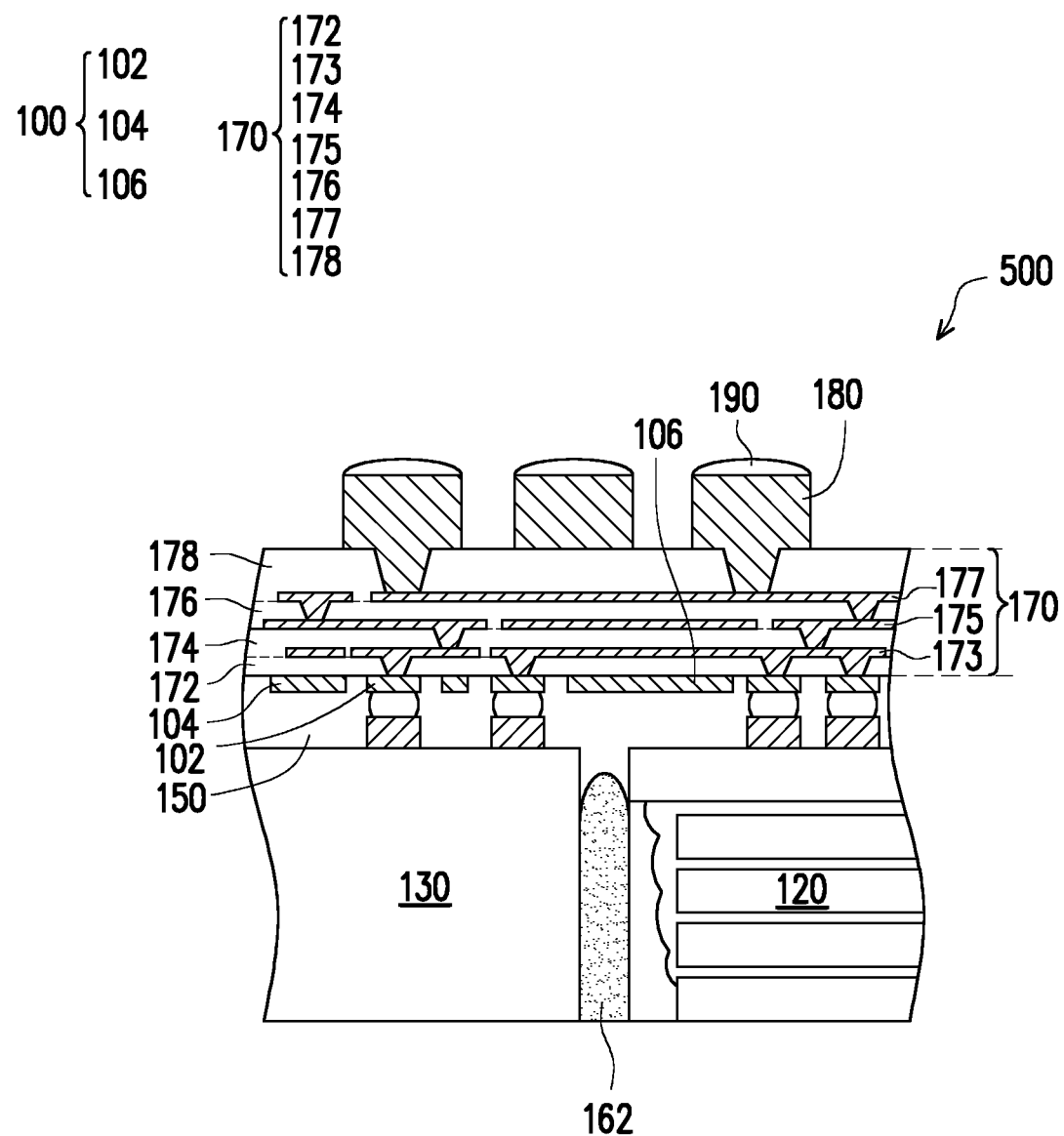

Referring to FIG. 8, a redistribution (RDL) structure 170 is formed on the metallic material layer 100 and is electrically connected to the first and second dies 120, 130. In some embodiments, the RDL structure 170 includes a plurality of polymer layers 172, 174, 176, 178 and a plurality of redistribution layers 173, 175, 177 stacked alternately. The number of the polymer layers or the redistribution layers is not limited by the disclosure. As shown in FIG. 8, the polymer layer 172 is formed on the metallic material layer 100 and on the underfill 150. The redistribution layer 173 is formed on the polymer layer 172 and penetrates through the polymer layer 172 to be electrically connected to the pads 102 of the metallic material layer 100. The polymer layer 174 is formed on the polymer layer 172 and the redistribution layer 173. The redistribution layer 175 is formed on the polymer layer 174 and penetrates through the polymer layer 174 to be electrically connected to the redistribution layer 173. The polymer layer 176 is formed on the polymer layer 174 and the redistribution layer 175. The redistribution layer 177 is formed on the polymer layer 176 and penetrates through the polymer layer 176 to be electrically connected to the redistribution layer 175. The polymer layer 178 is formed on the polymer layer 176 and the redistribution layer 177, and the polymer layer 178 includes openings O exposing the redistribution layer 177.

In some embodiments, each of the polymer layers 172, 174, 176, 178 includes a polymeric material such as polybenzoxazole (PBO), polyimide (PI), benzocyclobutene (BCB), a combination thereof or the like. In some embodiments, each of the redistribution layers 173, 175, 177 includes a metal material, such as copper, aluminum, nickel, titanium, a combination thereof or the like, and is formed by an electroplating process. In some embodiments, the redistribution layers 173, 175, 177 respectively include a seed layer (not shown). In some embodiments, the seed layer may be a metal seed layer such as a copper seed layer. In some embodiments, the seed layer may include a first metal layer such as a titanium layer and a second metal layer such as a copper layer over the first metal layer. In some embodiments, the material of the redistribution layers 173, 175, 177 and the material of the metallic material layer 100 (including the bolstering pattern 106) are different. In some embodiments, the material of the redistribution layers 173, 175, 177 and the material of the metallic material layer 100 (including the bolstering pattern 106) are substantially the same. In some embodiments, the redistribution layers 173, 175, 177 respectively include a plurality of vias and a plurality of traces connected to each other. The vias connects the redistribution layers 173, 175, 177, and the traces are respectively located on the polymer layers 172, 174, 176, 178, and respectively extend on the top surfaces of the polymer layers 172, 174, 176, 178. In some embodiments, the topmost redistribution layer 177 may be referred as under-ball metallurgy (UBM) layer for connector mounting. The layout of redistribution layers may form fan-out routings for wafer level packaging technology or for integrated fan-out (InFO) packages or package-on-package (PoP) structures.

As shown in FIG. 8, a plurality of conductive connectors 180 disposed on the polymer layer 178 and connected to the redistribution layer 177 are formed. In some embodiments, the conductive connector 180 includes a conductive bump. In some embodiments, the conductive connector 180 may further include a solder material 190 for assisting connection. It is understood that the configurations of the redistribution layers and the conductive connectors may be determined based on circuit design.

In the above processes, as the planarization process is performed to the backsides of the first and second dies before the formation of the RDL structure 170, this approach ensures possible encapsulation cracking induced by the planarization process will not affect the later formed RDL structure. Also, the existence of the bolstering pattern that is located between the redistribution layers of the RDL structure and the composite structure of the underfill and encapsulant further enlarge the reliability window for the package going through the torture test.

Figure 11:
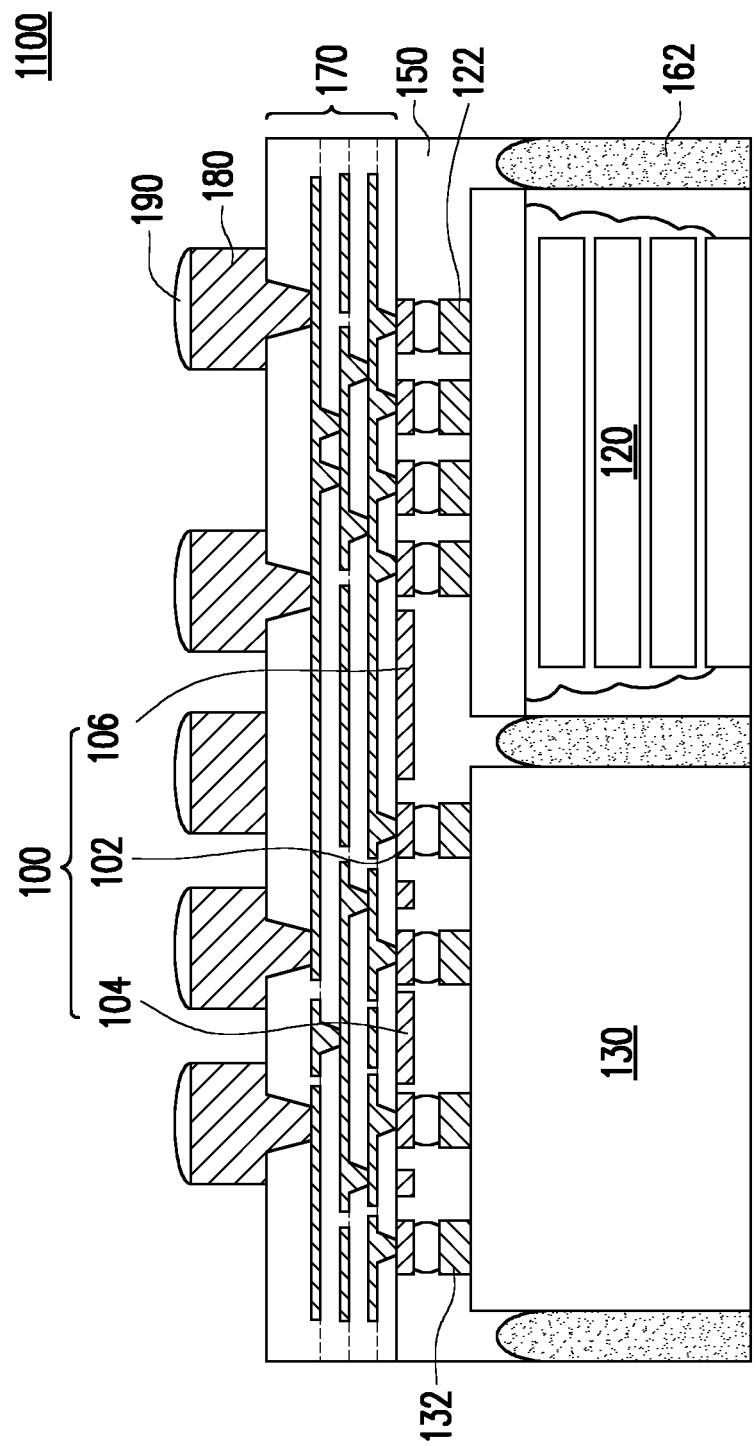
FIGS. 11-12 schematically illustrate semiconductor packages having redistribution layers in accordance with some embodiments.

FIG. 11 schematically illustrates a semiconductor package having more than one redistribution layers in accordance with some embodiments. In some embodiments, the structure shown in FIG. 11 may be formed following the processes described from FIG. 1 to FIG. 8, and after the formation of the redistribution structure 170 and the conductive connectors 180, the molded structure 500 may undergo a dicing process and the structure 500 is cut into a plurality of packages 1100. Referring to FIG. 11, the package 1100 includes the first die 120, the second die 130, the bolstering pattern 106, the RDL structure 170, the conductive connectors 180 and the solder material 190. In some embodiments, the redistribution structure 170 is disposed on the underfill 150 and is electrically connected with the first and second dies 120, 130. In FIG. 11, the bolstering pattern 106 is located on the bottom surface of the RDL structure 170 and laterally wrapped by the underfill 150. In some embodiments, the bolstering pattern 106 is sandwiched between the RDL structure 170 and the underfill 150 (located between the RDL structure 170 and the composite structure of the underfill 150 and the encapsulant 162) and is located between the first and second dies 120, 130. In some embodiments, the conductive connectors 180 are electrically connected with the RDL structure 170 and electrically connected with the first and second dies 120, 130.

Figure 12:
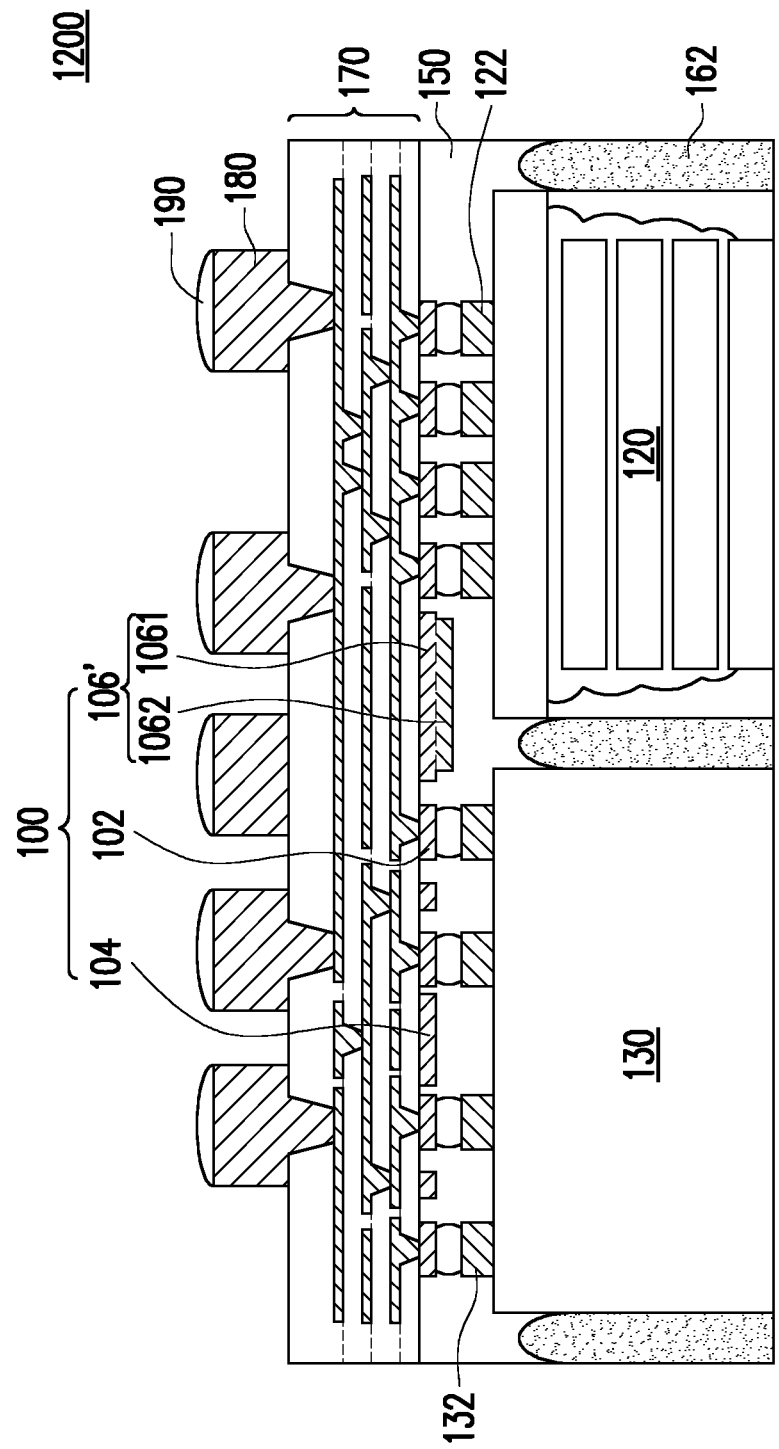

FIG. 12 schematically illustrates another semiconductor package having more than one redistribution layers in accordance with some embodiments. The structure of the package 1200 is similar to the structure of the package 1100, excerpt for the structure of the bolstering pattern 106' is a two-layered structure consisting of a bolstering pattern layer 1062 and a bolstering pattern layer 1061 stacked on the bolstering pattern layer 1062. In some embodiments, the structure shown in FIG. 12 may be formed following the processes described from FIG. 1 to FIG. 8, but after the formation of the metallic material layer 100 having the bolstering pattern layer 1062 (similar to the bolstering pattern 106 described in the above contexts), another material layer (not shown) is formed and patterned though photolithographic process and etching process to form the bolstering pattern layer 1061 on the bolstering pattern layer 1062. In one embodiment, the material of the bolstering pattern layer 1061 may be different from that of the bolstering pattern layer 1062. In one embodiment, the material of the bolstering pattern layer 1061 may be the same as that of the bolstering pattern layer 1062. In one embodiment, the pattern of the bolstering pattern layer 1061 is different from that of the bolstering pattern layer 1062, and the pattern span of the bolstering pattern layer 1061 is overlapped with but smaller than that of the bolstering pattern layer 1062. In one embodiment, when the bolstering pattern layer 1061 and the bolstering pattern layer 1062 are made of the same material, the bolstering pattern 106' may be regarded as an integral piece with a protruded portion. In FIG. 12, the bolstering pattern 106' is located on the bottom surface of the RDL structure 170 and laterally wrapped by the underfill 150, without contacting the encapsulant 162. For example, the bolstering pattern 106' has a thickness of about 10 microns.

In some embodiments, the bolstering pattern 106 or 106' is electrically isolated from the first and second dies 120, 130 and is not electrically connected with the RDL structure 170. In principle, the bolstering pattern 106/106' is not part of the electrically conductive path of the package 1100.

In alternative embodiments, the bolstering pattern 106/106' of the metallic material layer 100 functions as a ground plane to alleviate signal cross-talks in the package, leading to a better electrical performance for the package. The ground plane may be part of the return path of the signal so to reduce the signal-to-signal interaction.

Thermal cycles or mechanical stress during the fabrication of the packages may cause reliability problems, such as interface delamination or cracking of the redistribution layer(s). In some embodiments, the bolstering pattern 106 functions as a structural reinforcing element, which prevents cracking occurred in the above RDL structure 170, especially for fine-line RDL structure (having small line/space (L/S) feature ranging from 2-5 microns). The existence of the bolstering pattern 106 also helps to prevent cracking occurred in the underlying composite structure extending into the above RDL structure and helps to lower the failure rate of the package.

Figure 13:
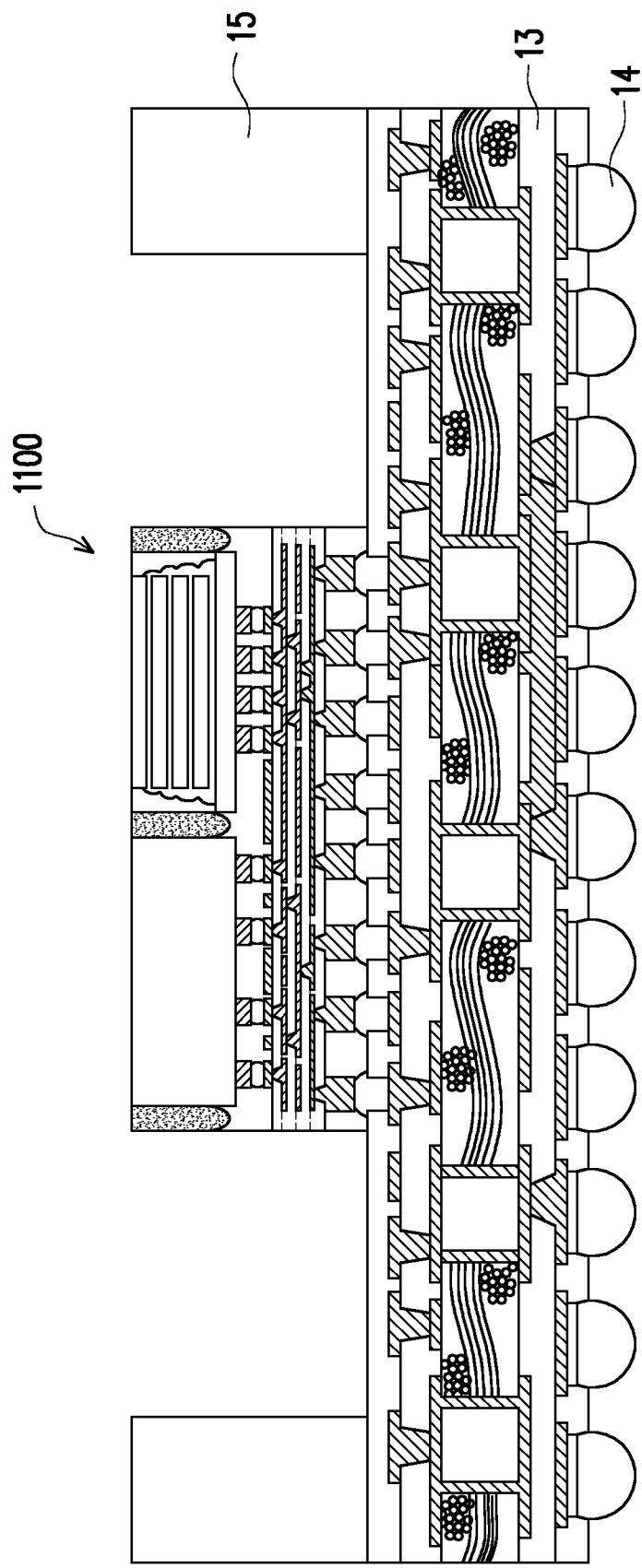
FIG. 13 schematically illustrates a package structure in accordance with some embodiments.

FIG. 13 schematically illustrates a package structure in accordance with some embodiments. In some embodiments, the package 1100 (or 1200) may be further assembled to a circuit substrate 13 and electrically connected to the circuit substrate 13. In addition, the package 1100 mounted on the circuit substrate 13 may be further electrically connected to outer apparatus or devices through the connector balls 14. The circuit substrate 13 optionally includes a ring structure 15 for enhancing structural strength or for improving heat dissipation. In some embodiments, the circuit substrate 13 may be a circuit board laminate such as a printed circuit board, and the connector balls 14 may be ball grid array (BGA) balls.

FIGS. 14-18 schematically illustrate various stages of processes for forming a package structure with redistribution layers according to a method of fabricating a semiconductor package in accordance with some embodiments.

Figure 14:
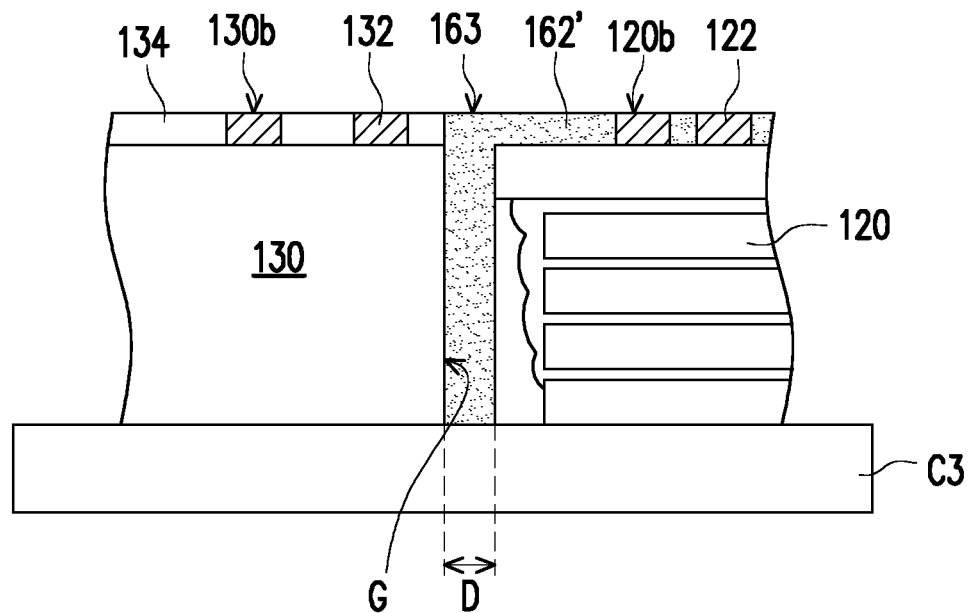
FIGS. 14-18 schematically illustrate various stages of processes for forming a package structure with redistribution layers according to a method of fabricating a semiconductor package in accordance with some embodiments.

In some embodiments, referring to FIG. 14, at least one first die 120 and at least one second die 130 are provided and disposed on the carrier C3 with their backsides in contact with the carrier C3. In some embodiments, the first die 120 including contact terminals 122 is provided, and the second die 130 including the contact terminal 132 embedded in a passivation layer 134 is provided. The first and two dies 120, 130 are disposed side-by-side and spaced apart from one another. In FIG. 14, the first die 120 and the second die 130 are posited apart from each other with a gap G (with a distance D). It is understood that a plurality of first dies 120 and a plurality of second dies 130 are provided, and the amount of the first dies 120 may be different from the amount of the second dies 130.

Referring to FIG. 14, in some embodiments, a planarized encapsulant 162' is formed over the carrier C3. For example, after the placement of the first and second dies 120, 130, an insulating encapsulation material (not shown) is formed over the carrier C3, encapsulating the first and second dies 120, 130 and fills up the gaps G between the first and second dies 120, 130. In embodiments, the insulating encapsulation material fully covers the contact terminals 122 of the first die(s) 120 and the contact terminals 132 of the second die(s) 130, and later a planarization process is performed to remove portions of the insulating encapsulation material to expose the contact terminals 122, 132 of the first and second dies 120, 130 and a planarized encapsulant 162' is obtained. In some embodiments, after planarization, the active surfaces 120b, 130b of the first and second dies 120, 130 are coplanar and levelled with the top surface 163 of the planarized encapsulant 162'. That is, the contact terminals 122, 132 of the first and second dies 120, 130 are exposed from the planarized encapsulant 162'. In some embodiments, the planarization process may include a chemical-mechanical polishing (CMP) process, a mechanical grinding process, a fly cutting process or an etching back process. In some embodiments, the planarization process may include a CMP process.

Figure 15:
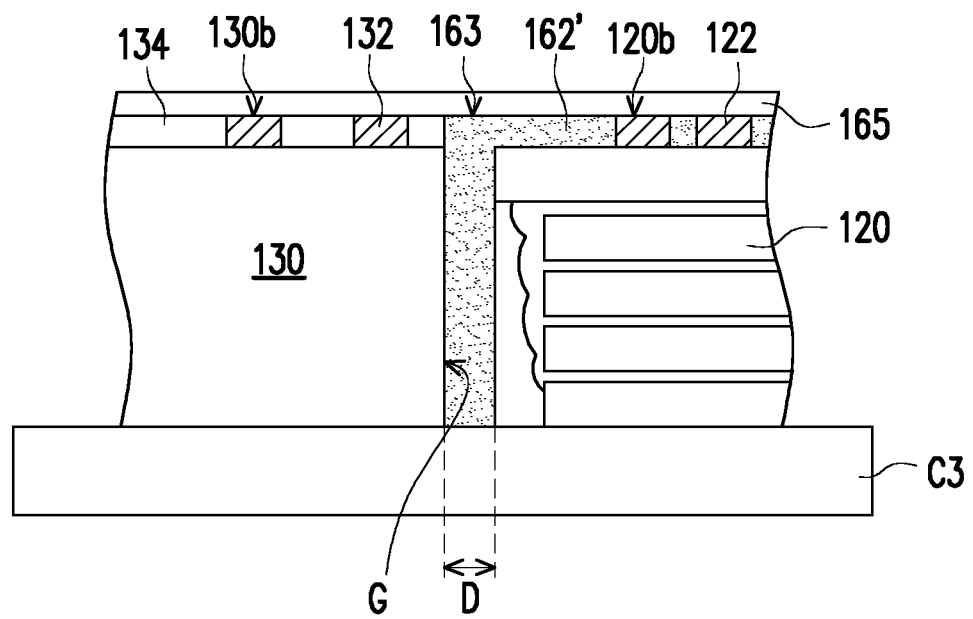
Figure 16:
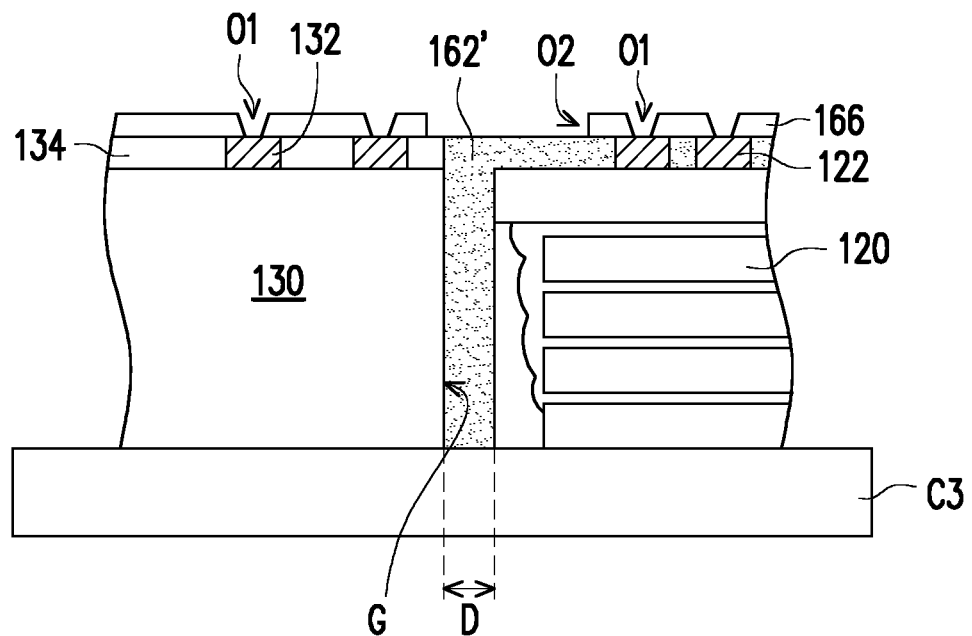
Figure 17:
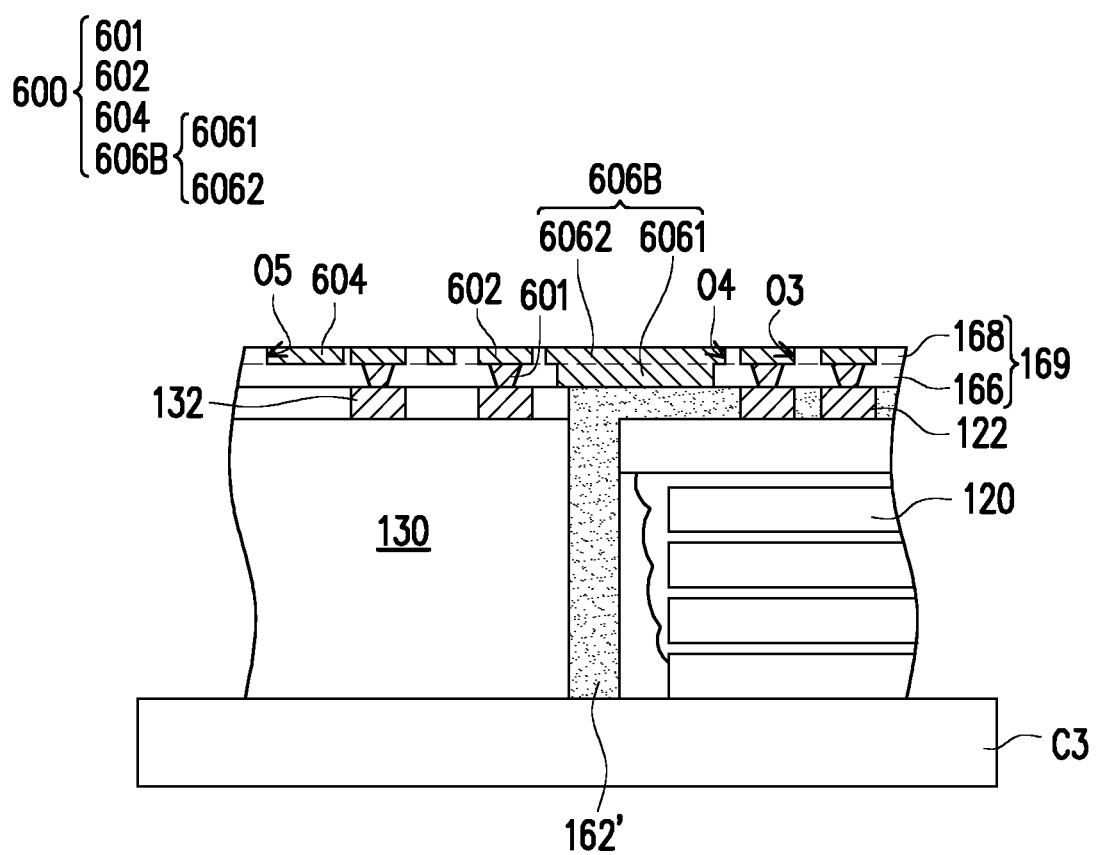

Referring to FIG. 15 & FIG. 16, a dielectric layer 165 is formed on the planarized encapsulant 162' and covers the first and second dies 120, 130. Then, the dielectric layer 165 is patterned through photolithography and etching processes to form a pattern layer 166. In some embodiments, the pattern layer 166 is formed with openings O1 to expose the underlying contact terminals 122, 132 and openings O2 exposing a portion of the encapsulant 162'. The locations of the openings O2 correspond to the locations of the to-be-formed bolstering patterns. In FIG. 16 and FIG. 17, another pattern layer 168 is formed on the pattern layer 166 with openings O3 and O4 respectively connecting with the openings O1 and O2 and openings O5 exposing portions of the underlying pattern layer 166. Later, a metallic material layer 600 is formed over the pattern layers 166, 168 and filling up the openings O1~O5. In one embodiment, the formation and the materials of the metallic material layer 600 may be similar to those of the metallic material layer 100 as described in the previous embodiments and details will not be repeated herein. In certain embodiments, the pattern layers 166, 168 may be regarded as a composite dielectric layer 169.

In some embodiments, the metallic material layer 600 includes vias 601 filled within the openings O1, pads 602 filled in the openings O3 and connected with the vias 601 and routing patterns 604 filled within the openings O5. The metallic material layer 600 also includes one or more bolstering patterns 606B consisting of a bolstering pattern layer 6061 filled in the opening O2 and a bolstering pattern layer 6062 filled in the opening O4. The formation of the metallic material layer 600 may employ the via first approach and sequentially forming the via plugs and then the trench filling patterns. In this case, the material of the bolstering pattern layer 6061 may be different from that of the bolstering pattern layer 6062. Alternatively, the formation of the metallic material layer 600 may employ the dual damascene approach by forming the dual damascene openings and then forming metallic patterns filling up the dual damascene openings. In this case, the material of the bolstering pattern layer 6061 may be the same as that of the bolstering pattern layer 6062. In FIG. 17, the bolstering pattern 606B penetrates through the composite dielectric layer 169 and is in direct contact with the encapsulant and the bottom surface of the RDL structure 170.

Figure 18:
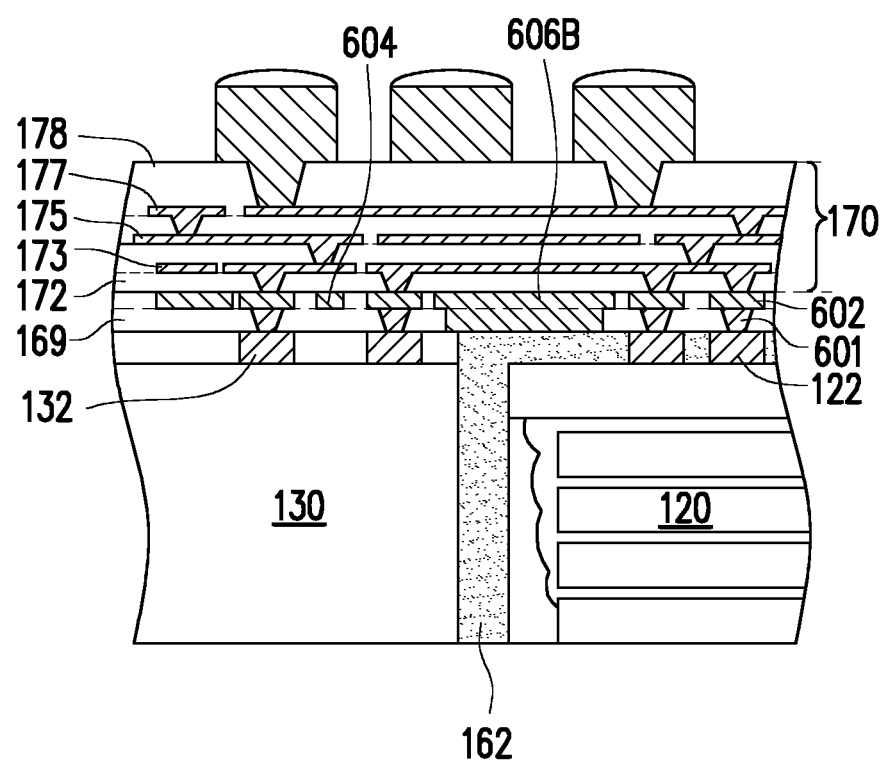

Referring to FIG. 18, the RDL structure 170 is formed on the metallic material layer 600 and over the pattern layers 166, 168. The RDL structure 170 is electrically connected with the first and second dies 120, 130 through the pads 602, vias 601 and contact terminals 122, 132 of the first and second dies 120, 130. The formation and the materials of the RDL structure 170 are similar to those of the RDL structure described in the processes of FIG. 8 and the details will not be repeated herein. In some embodiments, the material of the pattern layers 166, 168 may include a polymeric material such as polybenzoxazole (PBO), polyimide (PI), benzocyclobutene (BCB), a combination thereof or the like. In one embodiment, the material of the pattern layer 168 is the same as that of the polymer layer 172 or the same as any polymer layer of the RDL structure 170. In some embodiments, the material of the redistribution layers 173, 175, 177 of the RDL structure 170 and the material of the metallic material layer 600 (including the bolstering pattern 606B) are different. In some embodiments, the material of the redistribution layers 173, 175, 177 and the material of the metallic material layer 600 (including the bolstering pattern 606B) are substantially the same. Similarly, conductive connectors 180 and solder materials 190 are formed on the RDL structure 170 for further electrical connection.

In some embodiments, the bolstering pattern 606B is sandwiched between the RDL structure 170 and the encapsulant 162', extending from the bottom surface of the RDL structure 170 to the top surface of the encapsulant 162'. In embodiments, the bolstering pattern 606B spreads across the gap G and spreads beyond the edges of the first and second dies 120, 130. In some embodiments, the bolstering pattern 606B functions as a structural reinforcing element, which prevents cracking occurred in the above RDL structure 170 or prevents cracking occurred in the underlying encapsulant 162' extending into the above RDL structure 170, so that the failure rate of the package is minimized.

In some embodiments, the bolstering pattern 606B is electrically isolated from the first and second dies 120, 130 and is electrically isolated from the RDL structure 170. In principle, the bolstering pattern 606B is not part of the electrically conductive path of the package 1100.

In alternative embodiments, the bolstering pattern 606B of the metallic material layer 100 functions as a ground plane to alleviate signal cross-talks in the package, leading to a better electrical performance for the package.

The existence of the bolstering pattern that is located between the redistribution layers of the RDL structure and the encapsulant further reinforces the structural strength of the package and improves the reliability of the package.

Figure 19:
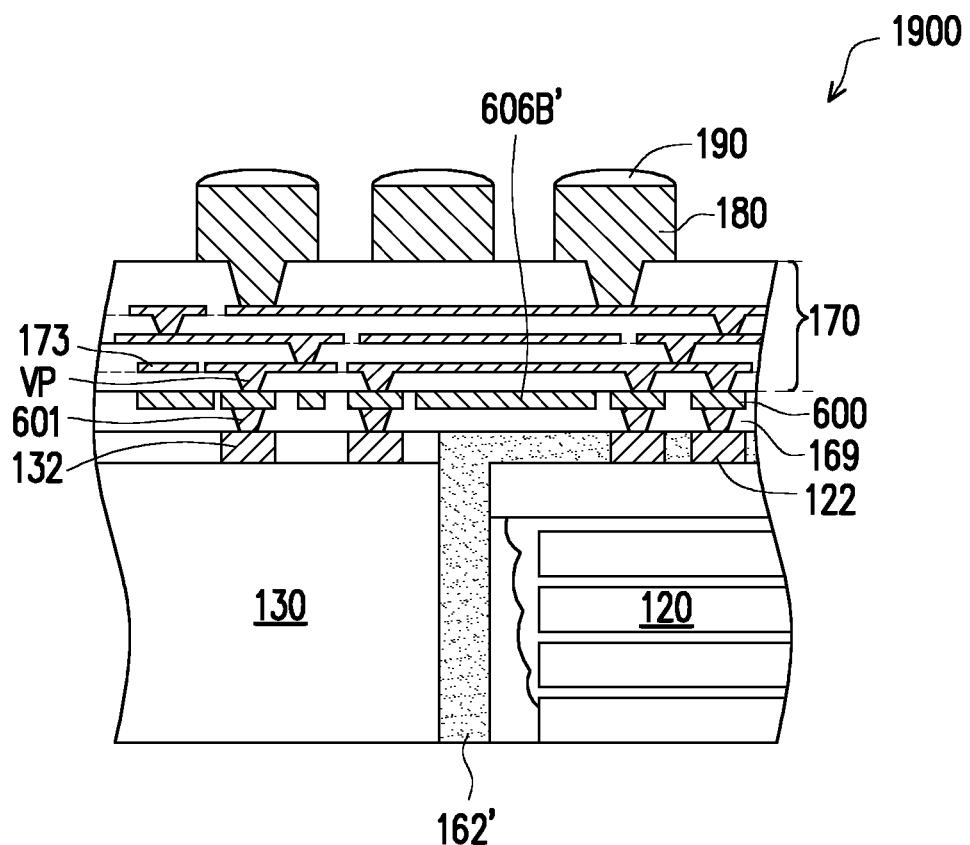
FIGS. 19-20 schematically illustrate semiconductor packages having redistribution layers in accordance with some embodiments.
Figure 20:
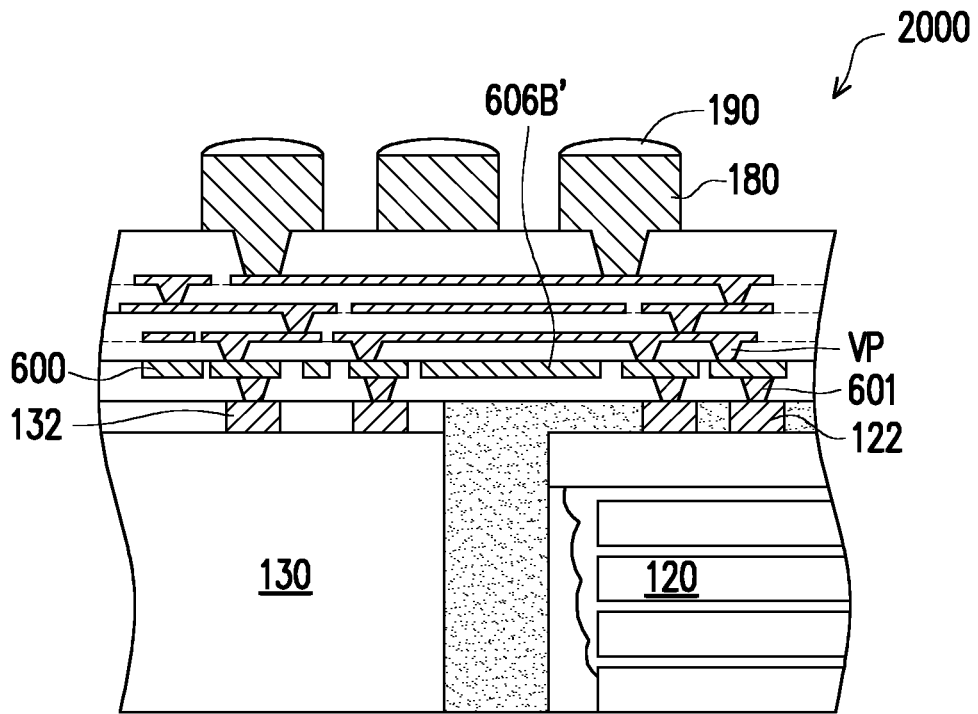

FIGS. 19-20 schematically illustrate structures having redistribution layers in accordance with some embodiments. In some embodiments, the structure shown in FIG. 19 or FIG. 20 may be formed following the processes described from FIG. 14 to FIG. 18. It is understood that the molded structure 1900 or 2000 may undergo a dicing process and then cut into a plurality of individual packages. Referring to FIG. 19, the molded structure 1900 includes the first die 120, the second die 130, the bolstering pattern 606B, the RDL structure 170, the conductive connectors 180 and the solder materials 190. In some embodiments, the redistribution structure 170 is disposed on the metallic material layer 600 and the dielectric layer 169 and is electrically connected with the first and second dies 120, 130. In FIG. 19, the bolstering pattern 606B' is located on the bottom surface of the RDL structure 170 and laterally wrapped by the dielectric layer 169 without contacting the encapsulant 162'. In some embodiments, the bolstering pattern 606B' is a single-layered structure and is located between the first and second dies 120, 130. In some embodiments, the locations of the vias 601 of the metallic material layer 600 correspond to and are vertically aligned with the locations of the via portions VP of the redistribution layer 173 of the RDL structure 170 and the RDL structure 170 is electrically connected with the first and second dies 120, 130.

Referring to FIG. 20, the molded structure 2000 is similar to the molded structure 1900, but the locations of the vias 601 of the metallic material layer 600 and the locations of the via portions VP of the redistribution layer 173 of the RDL structure 170 are vertically staggered.

The bolstering patterns as demonstrated and described in the above embodiments are applicable for various types of packages and the layout and design of the bolstering patterns relative to the redistribution layers may be modified based on the electrical requirements of the products.

In accordance with some embodiments of the present disclosure, a package is disclosed. The package includes a first semiconductor die, a second semiconductor die, a redistribution structure and a metallic bolstering pattern. The second semiconductor die is disposed beside the first semiconductor die and spaced apart from the first semiconductor die with a distance. The redistribution structure is disposed over the first semiconductor die and the second semiconductor die and is electrically connected with the first and second semiconductor dies. The metallic bolstering pattern is disposed between the redistribution structure and the first and second semiconductor dies. The metallic bolstering pattern is disposed on the redistribution structure and located over the first and second semiconductor dies, and the metallic bolstering pattern extends across the distance between the first and second semiconductor dies and extends beyond borders of the first and second semiconductor dies.

In accordance with some embodiments of the present disclosure, a package includes a first semiconductor die, a second semiconductor die, a redistribution structure and a metallic material layer. The first and second semiconductor dies are disposed side-by-side and separate from each other with a gap therebetween. The redistribution structure is disposed over the first and second semiconductor dies and is electrically connected with the first and second semiconductor dies. The metallic material layer is disposed between the redistribution structure and the first and second semiconductor dies. The metallic material layer includes pads and a bolstering pattern disposed on the redistribution structure and over the first and second semiconductor dies, and a vertical projection of the bolstering pattern falls within a span of the first semiconductor die, falls over the gap and falls within a span of the second semiconductor die.

In accordance with alternative embodiments of the present disclosure, a method of fabricating a package includes at least the following steps. A substrate is provided, and a metallic material layer having at least one bolstering pattern and pads is formed on the substrate. A first semiconductor die and a second semiconductor die are provided side-by-side onto the metallic material layer. Contact terminals of the first and second semiconductor dies are mounted to the pads and borders of the first and second semiconductor dies are aligned to fall into a span of the bolstering pattern. The contact terminals of the first and second semiconductor dies are bonded to the pads. The first and second semiconductor dies and the metallic material layer on the carrier are molded. The carrier is removed to expose the metallic material layer. A redistribution structure is formed on the metallic material layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
    a first semiconductor die;
    a second semiconductor die disposed beside the first semiconductor die and spaced apart from the first semiconductor die with a distance;
    a redistribution structure disposed over the first semiconductor die and the second semiconductor die and electrically connected with the first and second semiconductor dies; and
    a metallic bolstering pattern disposed between the redistribution structure and the first and second semiconductor dies, wherein the metallic bolstering pattern is disposed on the redistribution structure and located over the first and second semiconductor dies, and the metallic bolstering pattern extends across the distance between the first and second semiconductor dies and extends beyond borders of the first and second semiconductor dies.

2. The package according to claim 1, further comprising an underfill filled between the redistribution structure and the first and second semiconductor dies, and the metallic bolstering pattern is laterally wrapped by the underfill.

3. The package according to claim 2, wherein the metallic bolstering pattern includes a stack structure of a bottom bolstering pattern layer and a top bolstering pattern layer located on the bottom bolstering pattern layer.

4. The package according to claim 3, wherein a span of the top bolstering pattern layer is overlapped with a span of the bottom bolstering pattern layer, and the span of the top bolstering pattern layer is smaller than the span of the bottom bolstering pattern layer.

5. The package according to claim 2, further comprising an encapsulant located between facing sidewalls of the first and second semiconductor dies, wherein the underfill encapsulate contact terminals of the first and second semiconductor dies.

6. The package according to claim 1, further comprising an encapsulant laterally wrapping the first and second semiconductor dies, wherein the metallic bolstering pattern is located between the redistribution structure and the encapsulant.

7. The package according to claim 6, further comprising a dielectric layer located between the redistribution structure and the encapsulant and surrounding the metallic bolstering pattern, wherein the metallic bolstering pattern penetrates through the dielectric layer and contacts the redistribution structure and the encapsulant.

8. The package according to claim 6, further comprising a dielectric layer located between the redistribution structure and the encapsulant and surrounding the metallic bolstering pattern, wherein the metallic bolstering pattern is embedded in the dielectric layer, is in contact with the redistribution structure and is separate from the encapsulant.

9. The package according to claim 1, wherein the metallic bolstering pattern is a mesh pattern and the metallic bolstering pattern includes copper (Cu), aluminum (Al), silver (Ag), tin (Sn), gold (Au), nickel (Ni), titanium (Ti), combinations or alloys thereof.

10. A package, comprising:
    a first semiconductor die;
    a second semiconductor die, wherein the first and second semiconductor dies are disposed side-by-side and separate from each other with a gap therebetween;
    a redistribution structure disposed over the first and second semiconductor dies and electrically connected with the first and second semiconductor dies; and
    a metallic material layer disposed between the redistribution structure and the first and second semiconductor dies, wherein the metallic material layer includes pads and a bolstering pattern disposed on the redistribution structure and over the first and second semiconductor dies, and a vertical projection of the bolstering pattern falls within a span of the first semiconductor die, falls over the gap and falls within a span of the second semiconductor die.

11. The package of claim 10, wherein the pads are respectively connected with contact terminals of the first and second semiconductor dies, and the redistribution structure is electrically connected with the first and second semiconductor dies through the pads.

12. The package according to claim 10, wherein the metallic material layer includes vias respectively connected with the pads, and the redistribution structure is electrically connected with the first and second semiconductor dies through the pads and the vias.

13. The package according to claim 12, wherein the redistribution structure includes via portions connected with the pads of the metallic material layer, and locations of the via portions are aligned with locations of the vias.

14. The package according to claim 12, wherein the redistribution structure includes via portions connected with the pads of the metallic material layer, and locations of the via portions and the vias are staggered.

15. A package, comprising:
a first semiconductor die;
a second semiconductor die, wherein the first and second semiconductor dies are disposed side-by-side and separate from each other with a gap therebetween;
a redistribution structure disposed over the first and second semiconductor dies and electrically connected with the first and second semiconductor dies; and
a metallic material layer disposed between the redistribution structure and the first and second semiconductor dies, wherein the metallic material layer includes pads and a bolstering pattern disposed on the redistribution structure and over the first and second semiconductor dies, and a vertical projection of the bolstering pattern falls within a span of the first semiconductor die, falls over the gap and falls within a span of the second semiconductor die, and wherein the bolstering pattern is a mesh pattern.

16. The package of claim 15, wherein the pads are respectively connected with contact terminals of the first and second semiconductor dies, and the redistribution structure is electrically connected with the first and second semiconductor dies through the pads.

17. The package according to claim 15, wherein the metallic material layer includes vias respectively connected with the pads, and the redistribution structure is electrically connected with the first and second semiconductor dies through the pads and the vias.

18. The package according to claim 17, wherein the redistribution structure includes via portions connected with the pads of the metallic material layer, and locations of the via portions are aligned with locations of the vias.

19. The package according to claim 17, wherein the redistribution structure includes via portions connected with the pads of the metallic material layer, and locations of the via portions and the vias are staggered.

20. The package according to claim 15, wherein the bolstering pattern includes copper (Cu), aluminum (Al), silver (Ag), tin (Sn), gold (Au), nickel (Ni), titanium (Ti), combinations or alloys thereof.

* * * * *